United States Patent [19]

Nomura et al.

[11] Patent Number: 4,477,794
[45] Date of Patent: Oct. 16, 1984

[54] MAGNETORESISTIVE ELEMENT

[75] Inventors: Noboru Nomura, Kyoto; Kenji Kanai, Osaka; Nobuyuki Kaminaka, Osaka; Yuji Omata, Osaka, all of Japan

[73] Assignee: Matsushita Electric Industrial Co., Ltd., Osaka, Japan

[21] Appl. No.: 406,894

[22] Filed: Aug. 10, 1982

[30] Foreign Application Priority Data

Aug. 10, 1981 [JP] Japan .................... 56-124005
Dec. 11, 1981 [JP] Japan .................... 56-198387
Dec. 11, 1981 [JP] Japan .................... 56-198388

[51] Int. Cl.³ .................................. G11B 5/30
[52] U.S. Cl. .................... 338/32 R; 360/113; 365/158
[58] Field of Search ............ 338/32 R; 360/113; 324/252; 427/47, 129; 365/158, 8, 58

[56] References Cited

U.S. PATENT DOCUMENTS 4,052,748 10/1977 Kuijk ..................... 324/252 X
4,053,829 10/1977 Maruo .................... 338/32 R
4,321,640  3/1982 Van Gestel ............... 360/113
4,361,805 11/1982 Narimatsu et al. ......... 324/252 X
4,386,114  5/1983 Harms et al. ............. 427/47

OTHER PUBLICATIONS

Metzdorf et al., "The Design of Magnetoresistive Multitrack Read Heads for Magnetic Tapes," IEEE Transactions for Magnetics, vol. Mag-18, No. 2, Mar. 1982, pp. 763-768.
Coker, "Eliminating Barkhausen Noise in a Megnetoresistive Reproducing Transducer", IBM Technical Disclosure Bulletin, vol. 16, No. 8, Jan. 1974, pp. 2571-2572.

Primary Examiner—Roy N. Envall, Jr.
Assistant Examiner—Christopher N. Sears
Attorney, Agent, or Firm—Burgess, Ryan & Wayne

[57] ABSTRACT

The invention provides a magnetoresistive element which magnetostatically has magnetic anisotropy to control a domain structure and which eliminates Barkhausen noise that will cause abrupt movement of domain walls and irregular magnetization due to a change in the signal magnetic field, wherein a grating pattern is formed on at least one surface of a magnetoresistive film by a process in which a grating pattern is unidirectionally formed on the surface of a substrate and the magnetoresistive film of a ferromagnetic body is deposited thereon. Further, various magnetoresistive elements to which a novel bias method is applied are provided.

17 Claims, 46 Drawing Figures

LAPPING SCRATCH

LAPPING SCRATCH

MAGNETORESISTIVE ELEMENT

BACKGROUND OF THE INVENTION

The present invention relates to a magnetoresistive element with a thin ferromagnetic film, and a magnetic sensor or magnetic head to which the magnetoresistive element is applied.

In rectangular magnetoresistive elements, an ideal magnetic domain structure comprises gyrate magnetic domains. However, in practice, pattern edges may not be linearized due to overetching; and a modified layer due to a finishing process is formed as a surface layer which contacts a magnetic medium when the magnetoresistive element is used as a magnetic head. Thus, the domain structure becomes deteriorated. The disturbance of the domains causes abrupt domain wall transition and irregular magnetization when an external field is applied. Split and Barkhausen noise occur in a change in electric resistance, that is, in an output. Further, secondary harmonic distortion is increased in the playback waveform. Thus, the magnetoresistive element can hardly be used for commercial applications.

SUMMARY OF THE INVENTION

It is an object of the present invention to provide a magnetoresistive element of a ferromagnetic thin film for preventing Barkhausen noise which causes domain wall movement and irregular magnetization in response to a change in signal magnetic field.

In order to achieve the above object of the present invention, a grating pattern is formed on at least one surface of a magnetoresistive film to magnetostatically provide magnetic anisotropy to control the domain structure.

It is another object of the present invention to provide various types of magnetoresistive elements having a wide dynamic range and excellent output characteristics by using a novel bias method since the magnetic anisotropy represents unidirectional magnetic anisotropy along the grating pattern formed on the magnetoresistive film.

Other objects, features and advantages of the present invention will be apparent from the following detailed description taken in conjunction with the accompanying drawings.

DETAILED DESCRIPTION OF THE PRIOR ART

Figure 1:
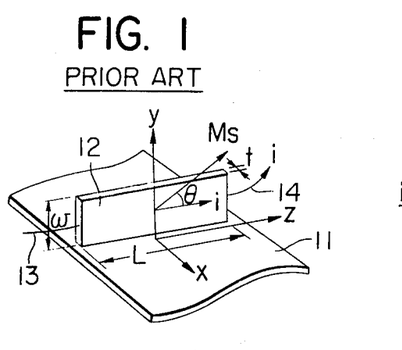
FIG. 1 is a perspective view showing the fundamental arrangement of a magnetic head to which a magnetoresistive element is applied.

A fundamental arrangement of a conventional head of a strip-shaped element which utilizes a magnetoresistance has been proposed as shown in FIG. 1, in which an electric resistance is changed when a magnetic field is applied to a ferromagnetic body. A magnetoresistive element 12 of a thin ferromagnetic plate comes into contact with or comes near to a recording medium 11 along the y-axis. Electrodes 13 and 14 are disposed at two ends of the magnetoresistive element 12 along its longitudinal direction (z-axis). A constant current i flows through the electrodes 13 and 14. A change in electric resistance along the z-axis which is caused by a signal magnetic field applied along the y-axis of the recording medium 11 is detected by a change in voltage produced from the electrodes 13 and 14. According to this detecting system, the intensity of the signal magnetic field from the recording medium 11 decreases exponentially with respect to a distance from the recording medium 11. In particular, when the wavelength of the recording signal on the recording medium is short, the attenuation of the signal magnetic field is great. For this reason, a width w of the strip-shaped element is preferably as small as possible in consideration of process precision and abrasion resistance.

A change $\Delta\rho$ in the specific resistance of the magnetoresistive element is given by the following relation when the thin ferromagnetic plate has a uniaxial anisotropy:

$$\Delta\rho = a + b \cos^2 \theta$$

where $\theta$ is the angle formed between the direction of a magnetization $M_s$ and the direction of the current i, and a and b are constants. The relationship between an applied magnetic field H and a rate of change in specific resistance ($\Delta\rho/\Delta\rho_{max}$ obtained by dividing the change $\Delta\rho$ in specific resistance by its maximum value $\Delta\rho_{max}$) has significant nonlinearity since the relationship is saturated for H=$H_s$. In order to improve this nonlinearity, a bias magnetic field $H_B$ is applied to properly set an operation point. In the optimal operation point, the bias magnetic field $H_B$ is $H_s/\sqrt{2}$, and the angle $\theta$ is 45°.

In order to increase the rate of change in the specific resistance of the magnetoresistive element and to avoid hysteresis characteristics, a thin ferromagnetic plate which is uniaxially oriented is generally used. An example is a strip-shaped element shown in FIG. 2. When this element is oriented along the longitudinal direction thereof, its orientation is very stable. However, a bias magnetic field of about $H_B \simeq 4\pi M_s \cdot t/w$ must be applied corresponding to a demagnetizing field along the transverse direction of the element so as to set the direction of the magnetization at an angle of 45° corresponding to the operation point (where t is the element thickness). This bias magnetic field is considerably intense; the bias magnetic field $H_B$ is applied in the direction indicated by the dotted line which has a magnetization component in the transverse direction of the element. Assume that the magnetization of the element is oriented at an angle $\theta$ from the longitudinal direction of the element.

Figure 2:
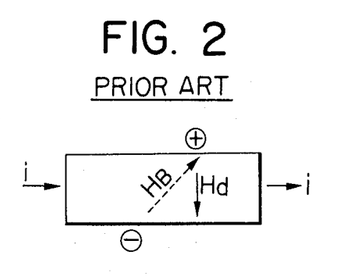
FIG. 2 is a view for explaining the mode of operation of the magnetic head shown in FIG. 1.

The demagnetizing field $H_d$ is produced, as indicated by the solid line, by a magnetic charge produced along the transverse direction of the element. The direction of the magnetization $M_s$ is deviated in the longitudinal direction of the element, so that the initial value of the angle $\theta$ cannot be kept.

Figure 3A:
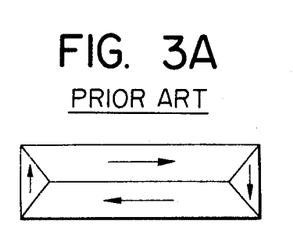
FIG. 3A is a view showing an ideal domain structure of a conventional magnetoresistive element.
Figure 3B:
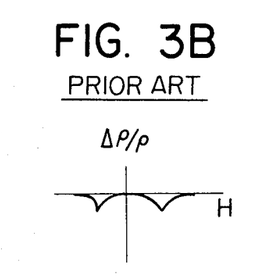
FIGS. 3B and 3C are graphs for explaining magnetoresistive characteristics along the axes of easy magnetization and hard magnetization respectively.
Figure 3C:
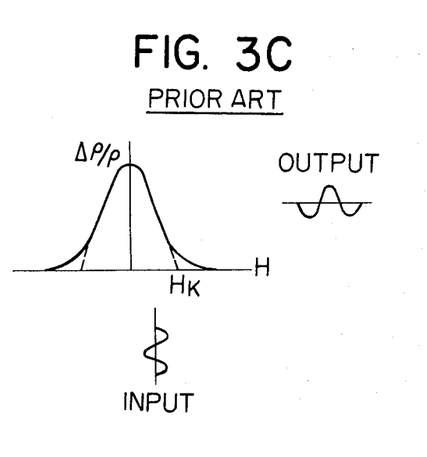
Figure 4A:
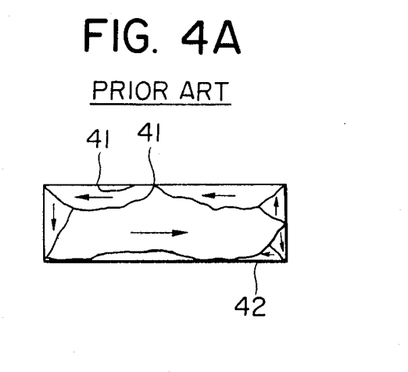
FIG. 4A is a view showing an actual domain structure of the conventional magnetoresistive element.
Figures 4B, 4C:
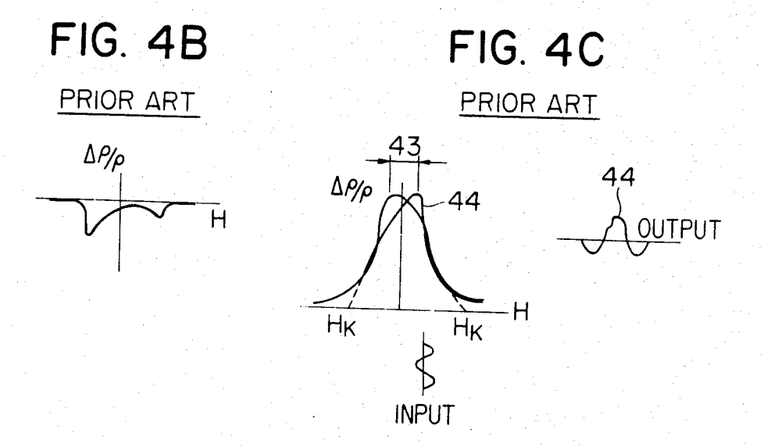
FIGS. 4B and 4C are graphs for explaining the magnetoresistive characteristics along the axes of easy magnetization and hard magnetization respectively.

Further, if the strip-shaped magnetoresistive element is used, the domain structure is ideally the gyrate domain structure as shown in FIG. 3A. The magnetoresistive characteristics are shown in FIGS. 3B and 3C. However, in practice, as shown in FIG. 4A, nonlinearity disturbance 41 occurs at the pattern edges and a surface layer is formed as a modified layer 42 in the finishing process. Thus, the domain structure is deteriorated, and its magnetoresistive characteristics become as shown in FIGS. 4B and 4C. The nonlinear edges cause abrupt magnetic wall movement and irregular magnetization when an external magnetic field is applied. A split 43 and Barkhausen noise 44 occur in a change in resistance which is an output. Therefore, the secondary harmonic distortion of the playback waveform is increased, and the magnetoresistive element of this type cannot be used for commercial applications.

DESCRIPTION OF THE PREFERRED EMBODIMENTS

Figure 5A:
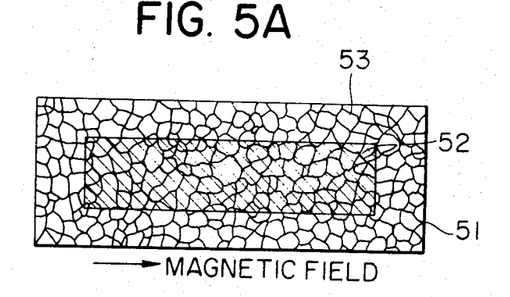
FIG. 5A is a plan view of a magnetoresistive element according to a first embodiment of the present invention.
Figure 5B:
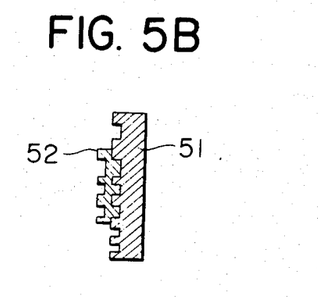
FIG. 5B is a sectional view of the element shown in FIG. 5A.
Figure 7A:
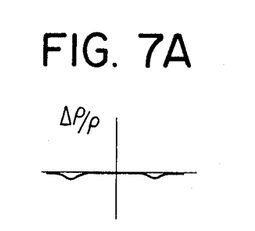
FIGS. 7A and 7B are graphs for explaining the magnetoresistive characteristics along the axes of easy magnetization and hard magnetization, respectively, when a grating pattern is formed on a substrate.
Figure 7B:
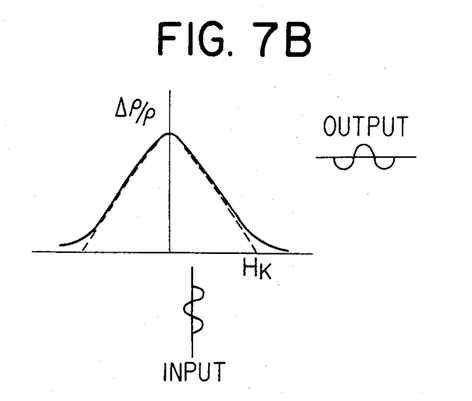

FIGS. 5A and 5B show a magnetoresistive element according to a first embodiment of the present invention. Referring to FIG. 5A, when a thin $Al_2O_3$ film or the like is deposited on the surface of a substrate 51 which is then covered with a magnetoresistive film 52 (to be referred to as an MR film 52 hereinafter), the growth rate of each grain of a crystal 53 differ from each other, so that a number of gratings, that is, a grating pattern, is formed on the thin $Al_2O_3$ film. The magnetostatic energy is affected by the pitch of the grating pattern, so that an anisotropic magnetic field $H_K$ is controlled. FIGS. 7A and 7B show film characteristics when a magnetic field is longitudinally applied along the MR film 52, that is, in the direction indicated by the arrow, while the MR film 52 is being formed. As is apparent from FIGS. 7A and 7B, the magnetoresistive characteristics are substantially good, and the output waveform obtained in response to the input signal magnetic field is ideally shaped. In the magnetoresistive element shown in FIG. 5A, since the grating pattern on the surface is isotropic, dispersion tends to occur as a result of changes in the directions of the anisotropic magnetization at given locations. Therefore, the symmetry with respect to the abscissa and sensitivity of the magnetoresistive characteristics are degraded.

Figure 6A:
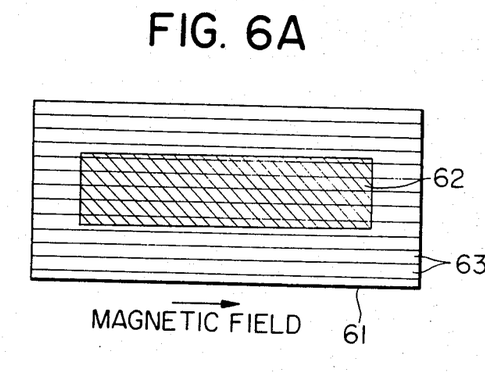
FIG. 6A is a magnetoresistive element according to a second embodiment of the present invention.
Figure 6B:
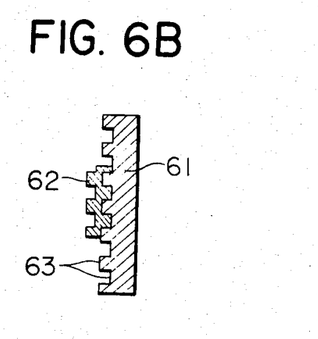
FIG. 6B is a sectional view of the element shown in FIG. 6A.

FIGS. 6A and 6B show a magnetoresistive element according to a second embodiment of the present invention. A photoresist pattern of 2 $\mu$m pitch is selectively formed by photolithography on the surface of a substrate 61 which is then covered with an MR film 62. The substrate 61 is selectively etched by wet or dry etching using the photoresist pattern as a mask, so that a periodic grating pattern 63 is formed on the surface of the substrate 61. Subsequently, while a magnetic field is being applied along the grooves of the grating pattern, the MR film 62 is deposited thereon. The same effects as obtained in the first embodiment can be obtained as shown in FIGS. 7A and 7B. Thus, the MR output waveform obtained in response to the input signal magnetic field indicates excellent linearity. In this case, the magnetic anisotropy is controlled by the magnetostatic anisotropy of the grating pattern. Further, dispersion of anisotropy is substantially prevented, so that excellent magnetoresistive characteristics without dispersion and hysteresis are obtained. Further, since the magnetic field is applied, the dispersion of anisotropy is further prevented.

Figure 8:
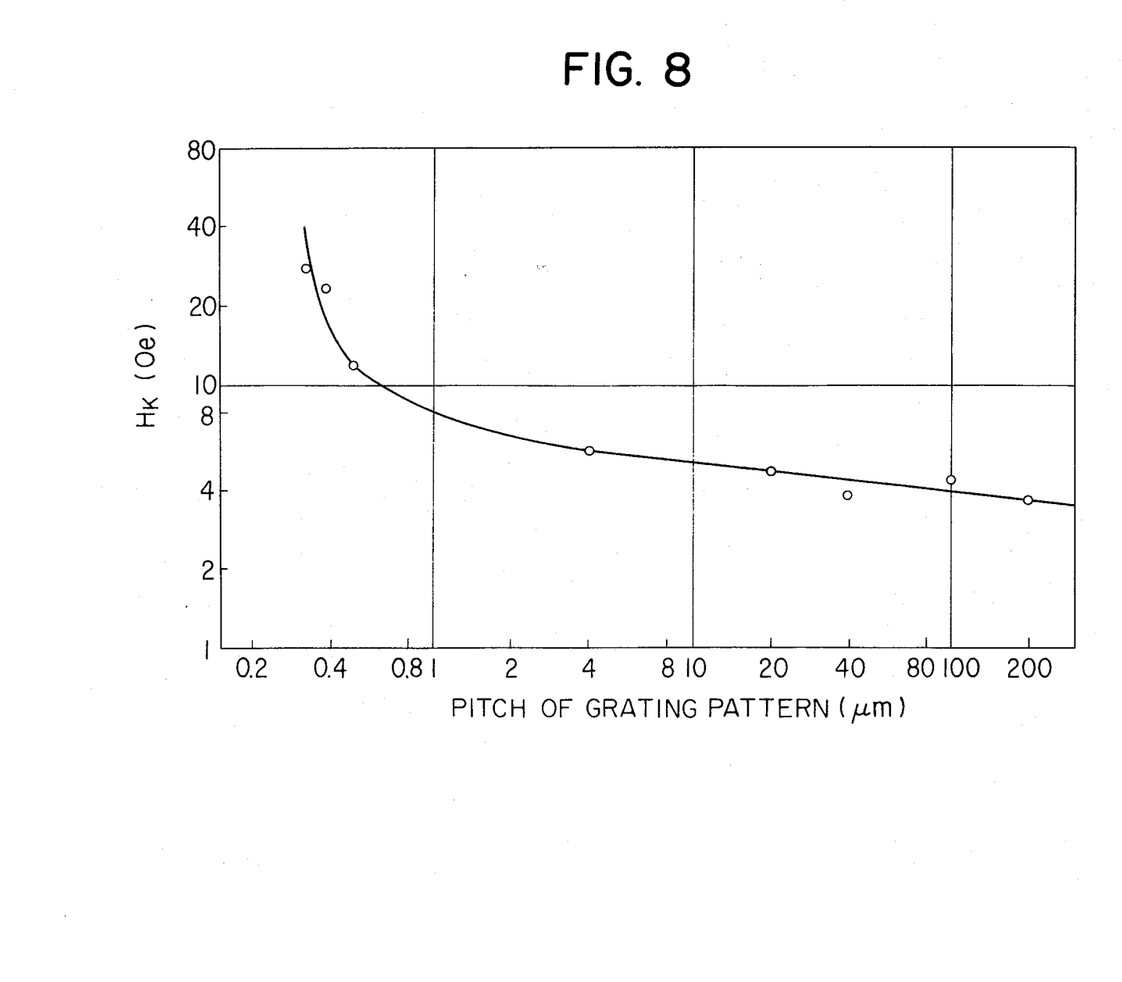
FIG. 8 is a graph for explaining an anisotropic magnetic field as a function of the pitch of the grating pattern formed on the substrate.

FIG. 8 shows changes in the anisotropic magnetic field $H_K$ as a function of the pitch of the grating pattern. If the pitch of the indentation pattern is more than 10 μm, the effect of the grating pattern is not substantially obtained, so that the anisotropic magnetic field $H_K$ is not substantially affected. However, if the pitch of the grating pattern is less than 10 μm, the anisotropic magnetic field intensity is 5 Oe compared with the intensity (3.4 Oe) of the anisotropic magnetic field $H_K$. An increase in the anisotropic magnetic field intensity is about 50% with respect to field induced magnetic anisotropy on application of the magnetic field. Thus, the effect of the magnetic anisotropy induced by the grating pattern becomes significant, decreasing Barkhausen noise in practice.

This is because the domains are aligned along the grating pattern and the domains are divided so as to keep their orientation uniform.

Furthermore, when the pitch of the grating pattern is less than 4 μm, the magnetic anisotropy induced by the grating pattern is greater than the anisotropy induced by the magnetic field, and an induced magnetic anisotropy can be sufficiently obtained only be deposition of the MR film on the grating even under no application of a magnetic field.

As may be apparent from the above description, when the MR element is formed using the induced magnetic anisotropy due to the grating pattern, the following advantages are obtained:

(1) The domains are subdivided by the grating.
(2) The orientation of the domains can be controlled along the grating pattern formed on the substrate.
(3) The intensity of the anisotropic magnetic field can be controlled by the pitch of the grating pattern.
(4) Productivity is improved since the induced magnetic anisotropy can be sufficiently obtained while applying no external magnetic field.

As compared with the case shown in FIG. 4, even if the domains become deteriorated due to the nonlinear edges caused by overetching and due to the effect of the modified layer in the finishing process, the deterioration of the domains may not extend over the entire surface of the film as shown in FIG. 4, since the domains are subdivided by the grating pattern. As a result, Barkhausen noise is decreased, and a satisfactory playback waveform can be obtained. Furthermore, since the orientation is controlled by the grating pattern, deterioration of the domains due to dispersion is prevented, and the secondary harmonic component may not be increased. Thus, a stable playback waveform is obtained.

When the MR element is applied to a magnetic sensor or magnetic head, an excellent playback waveform without Barkhausen noise is obtained.

Figure 9A:
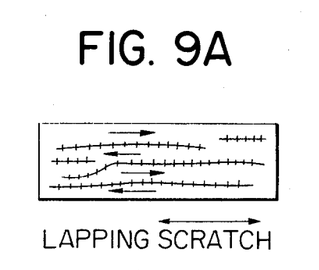
FIG. 9A is a view showing a domain structure of a magnetoresistive element according to a third embodiment of the present invention.
Figure 9B:
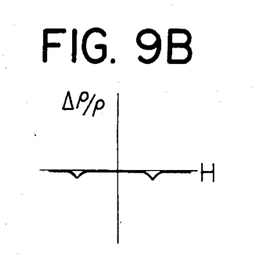
FIGS. 9B and 9C are graphs for explaining the magnetoresistive characteristics along the axes of easy magnetization and hard magnetization.
Figure 9C:
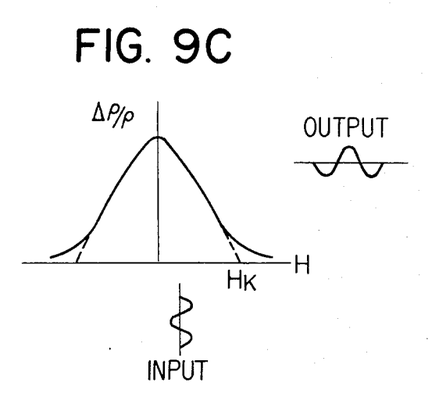

FIG. 9A shows a magnetoresistive element according to a third embodiment of the present invention. The surface of a glass substrate on which a magnetoresistive film is later deposited is abraded by a lapping tape in one direction. The surface of the glass substrate is anisotropically roughened by lapping scratches. According to the third embodiment, the lapping scratches are formed parallel to the current-flowing direction of the magnetoresistive element. A distance between the adjacent lapping scratches is random. However, with a proper lapping process, the distance may be 5 μm in average. The domains are aligned along the lapping scratches; they are subdivided and their orientation is excellent.

Figure 10A:
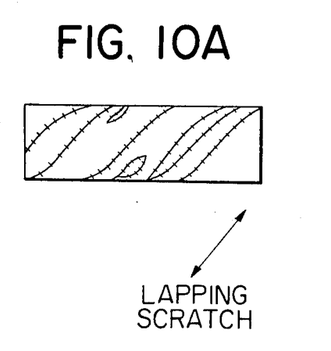
FIG. 10A is a view showing a domain structure of a magnetoresistive element according to a fourth embodiment of the present invention.

FIG. 10A shows a magnetoresistive element according to a fourth embodiment of the present invention. The surface of a glass substrate on which a magnetoresistive film is later deposited is unidirectionally abraded by a lapping tape at an angle of 45° with respect to the current-flowing direction of the magnetoresistive element. In the same manner as in the case in FIG. 9A, the domains are subdivided and are aligned along the lapping scratches. A highly precise orientation at the angle of 45° with respect to the current-flowing direction is obtained.

FIGS. 9A and 10A, FIGS. 9B and 10B, and FIGS. 9C and 10C respectively show domain patterns, magnetoresistive characteristics of the axes of easy magnetization, and magnetoresistive characteristics of the axes of hard magnetization together with waveforms of the playback signals when a magnetic field of a small signal is applied, in the same manner as in FIGS. 3A and 4A, FIGS. 3B and 4B, and FIGS. 3C and 4C. The magnetoresistive elements in FIGS. 9A and 10A are compared with those in FIGS. 3A and 4A.

Referring to FIG. 3A again, since the domain structure has the ideal gyrate domain pattern, some domains which are not oriented along the axis of easy magnetization cause a large output in the magnetoresistive characteristics (FIG. 3B) which is the rate ($\Delta\rho/\rho$) of change in the specific resistance along the axis of easy magnetization with respect to the magnetic field. An orientation ratio of the magnetoresistive characteristics (FIG. 3C) in the axis of hard magnetization to those in the axis of easy magnetization is small. When the bias magnetic field $H_B$ is applied and a magnetic field of a small signal is applied for the magnetoresistive characteristics (FIG. 3C), excellent playback output is obtained. However, since the intensity of the anisotropic magnetic field $H_K$ is small, the dynamic range is small. Further, if the intensity of the signal magnetic field is near zero, the secondary harmonic distortion is increased and Barkhausen noise is induced.

The domain pattern shown in FIG. 4A is not uniform as compared with that in FIG. 3A. The output of the magnetoresistive characteristics (FIG. 4B) in the axis of easy magnetization is great, and is assymetrical with respect to the axis of ordinate ($\Delta\rho/\rho$). The split 43 occurs in the magnetoresitive characteristics (FIG. 4C) in the axis of hard magnetization due to their hysteresis, and the Barkhousen noise 44 occurs corresponding to an abrupt change in magnetization. In the same manner as described above, when a magnetic field of a small signal is superposed on the bias magnetic field $H_B$, the Barkhousen noise 44 occurs in the playback output. Further, since hysteresis is inherent to the magnetoresistive characteristics, the waveform distortion is increased. The magnetoresistive element cannot be used in practice.

Referring to FIG. 9A, the domains are aligned along the lapping scratches and are subdivided, so that the magnetoresistive effect (FIG. 9B) in the axis of easy magnetization are small, and the orientation ratio is great. The intensity of the anisotropic magnetic field $H_K$ of the magnetoresistive characteristics (FIG. 9C) in the axis of hard magnetization is increased since the magnetization energy is increased. Therefore, linearity increases due to the superposition of small signal magnetic field on the bias magnetic field $H_B$ on the effect of the magnetoresistive characteristics, so that the dynamic range is widended. Further, since the domains are subdivided and their orientation of magnetization is coherent. Barkhousen noise may not be produced, and an excellent playback output waveform is obtained.

Referring to FIG. 10A, the lapping scratches are formed at an angle of 45° with respect to the longitudinal direction of the element, so that the domains are subdivided and their orientation is stable. The magnetoresistive charcteristics (FIG. 10B) in the playback current-flowing direction are substantially the same as those (FIG. 10C) in the direction perpendicular to the current-flowing direction. In this case, a bias magnetic field is not required. The domains are biased at an angle of 45°. Thus, the playback signal waveform having stable linearity is obtained in response to the input signal magnetic field without biasing the magnetic field. The intensity of the anisotropic magnetic field $H_K$ of the magnetoresistive characterisitics is increased when the domains are subdivided. The dynamic range of the output is increased and Barkhousen noise may not be produced.

In the magnetoresistive elements according to the present invention, the domains are subdivided and stably oriented as compared with the conventional magnetoresistive elements shown in FIGS. 3A and 4A. As a result, a magnetoresistive element which does not produce Barkhousen noise or a magnetoresistive element which does not require an external bias magnetic field is provided according to the present invention.

In the third and fourth embodiments respectively shown in FIGS. 9A and 10A, the grating pattern on the surface of the substrate which is then covered with the magnetoresistive element is formed as the lapping scratches. The depth of the scratch formed by a lapping tape of #4000 to #8000 is about 20 to 100 Å. The pitch between the scratches is about 5 μm. The intensity of the anisotropic magnetic field of the magnetoresistive characteristics is closely related to the depth and width of the scratch. In order to properly control the dynamic range, a uniform pattern must be used. The substrate is selectively etched by dry or wet etching using a photoresist film as a mask to a thickness less than the thickness of the magnetoresistive element. Thus, a grating pattern is formed on the surface of the substrate. When the magnetoresistive film is formed on the grating pattern, the same indentation pattern is formed on the surface of the magnetoresistive film. If the depth of grating is greater than the film thickness, the magnetoresistive film is not rendered conductive in a step portion. Thus, the magnetoresistive film as the element is not at all reliable.

The grating pattern is formed on the surface of the substrate in the above embodiments. However, the same effect can be obtained when a grating pattern is formed on the magnetoresistive film.

The magnetoresistive film of an alloy (Ni/Fe:83/17) is deposited on the substrate in a magnetic field so that magnetic anisotropy is induced. When the direction of the anisotropic magnetic field is parallel to the linear grating pattern, the orientation of the domains is stabilized, thus obtaining excellent magnetoresistive characteristics.

Figure 10B:
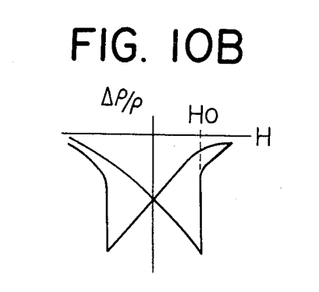
FIGS. 10B and 10C are graphs for explaining the magnetoresistive characteristics in the same direction as the playback current and in the direction perpendicular thereto.
Figure 10C:
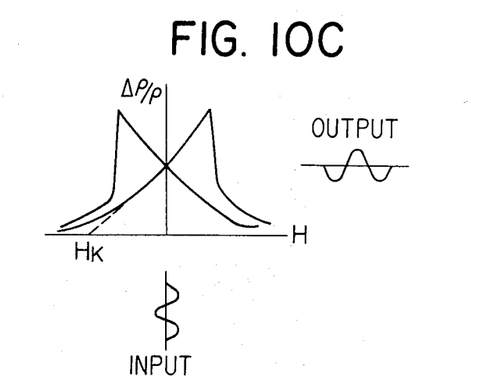
Figure 11A:
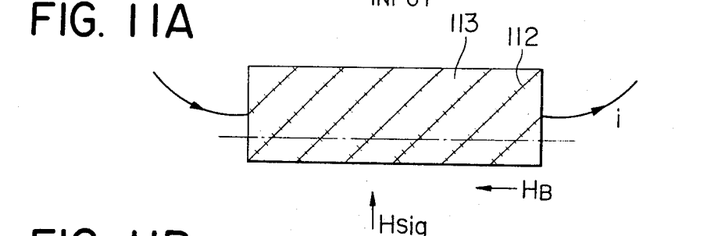
FIG. 11A is a plan view of a magnetoresistive element according to a fifth embodiment of the present invention.
Figure 11B:
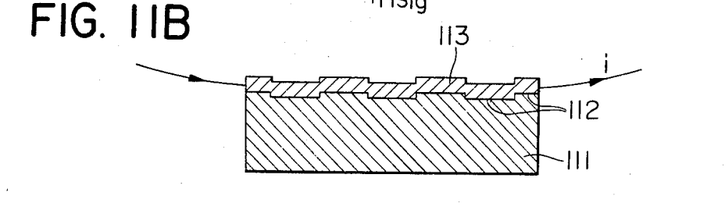
FIG. 11B is a sectional view of the element shown in FIG. 11A.

FIG. 11 is a magnetoresistive element according to a fifth embodiment of the present invention. According to this embodiment, a magnetoresistive film 113 is deposited on the surface of a substrate 111. The surface has a grating pattern 112. The direction of the current i is inclined at an angle of 45° with respect to the the grating pattern. A signal magnetic field $H_{sig}$ is applied perpendicularly to the current-flowing direction. If the magnetic flux of the signal magnetic field $H_{sig}$ has a large magnitude, the magnetoresistive characteristics have hysteresis, as shown in FIG. 10. This is because the magnetization is reversed by the signal magnetic field $H_{sig}$ and the magnetization between the lapping scratches is moved irreversibly. And so the dynamic range at an angle 45° becomes small. However, when the bias magnetic field $H_B$ is applied along the current-flowing direction as shown in FIG. 11A, magnetization is maintained, so that only a reversible magnetization rotation occurs.

In this embodiment, the grating pattern is inclined at 45° with respect to the longitudinal direction of the element. This may be the case when a demagnetizing field arising from the shape of the magnetoresistive element is not considered. However, if the effect of the demagnetizing field due to the shape of the magnetoresistive element is considered, the grating pattern may be inclined in a range of 30 to 60° depending upon the design of the element.

Figure 12A:
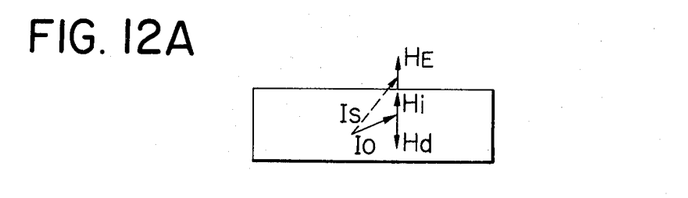
FIG. 12A is a view for explaining the mode of operation of the element when an angle of 30° to 45° is formed between the direction of the grating pattern on the element and the direction of the current.
Figure 12B:
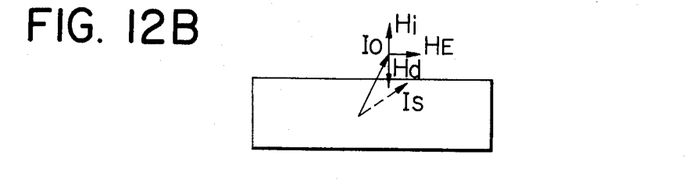
FIG. 12B is a view for explaining the mode of operation of the element when the angle is in a range of 45° to 60°.

As shown in FIGS. 12A and 12B, the angle formed by the direction of the grating pattern and the longitudinal direction of the element is determined to be 45° for the bias point of magnetization $I_s$ such that the surperimposed field, which is the sum of the anisotropic magnetic field Hk induced by the grating, demagnetizing field Hd induced by the shape of MR element, a magnetic field Hi induced by the MR sensing current and an externally applied magnetic field He, direct the magnetization Is toward the optimum biasing point.

If the grating pattern is inclined by less than 45° with respect to the direction of current flowing through the MR element (FIG. 12A), the externally applied magnetic field $H_E$ is applied perpendicularly to the longitudinal direction of the MR element to increase the angle of the magnetization $I_0$ oriented by the grating pattern. However, if the indentation pattern is inclined by more than 45° with respect to the direction of current flowing through the MR element (FIG. 12B), the externally applied magnetic field $H_E$ is applied parallel to the longitudinal direction of the MR element to decrease the angle of the magnetization $I_0$ oriented by the grating pattern. At this time, the direction of the external magnetic field is the same as that of the vectors of the magnetization $I_0$. When an external magnetic field whose direction is opposite to the direction of the magnetization $I_0$ is applied, the magnetization $I_0$ becomes unstable, and the magnetization may be 180° reversed.

The pitch of the grating pattern is considered when the pattern is used to bias the magnetization with reference to FIG. 8. If the pitch of the grating pattern is more than 10 μm, the effect of the grating pattern is not substantially found, so that the anisotropic magnetic field $H_K$ is not substantially changed. Assume that the width of the MR element is 100 μm and its thickness is 500 Å, provided that the demagnetizing field coefficient is $5 \times 10^{-4}$, and also that the magnetization is inclined at an angle of 45° with respect to the longitudinal direction of the MR element. Magnetic charge $I_s/\sqrt{2}$ is formed at the end faces of the film, and a demagnetizing field of about 3.5 Oe is generated to the MR element. The direction of the magnetization is inclined at an angle of 45° with respect to the direction of the current flowing through the MR element by the magnetic field $H_i$ generated upon flowing of the current through the MR element and by the external magnetic field $H_E$ against the demagnetizing field. Referring to FIG. 10B, a reversed magnetic field $H_0$ is substantially equal to $H_K/2$. Therefore, the intensity of the input signal magnetic field $H_s$ must be set so that the input signal magnetic field $H_s$ is smaller than the reversed magnetic field $H_0$. In a shielded type MR head which has shield films on the upper and lower surfaces of the magnetoresistive film, the magnetization can be unidirectionally oriented from 3 Oe of the reversed magnetic field $H_0$, that is, from about 6 Oe of the anisotropic magnetic field $H_K$. Further, the direction of the magnetization is kept at an angle of 45° with respect to the current-flowing direction. Thus, outstanding practical improvements are noticed. The above result is especially found in the grating pattern of 5 μm pitch where the anisotropic magnetic field is increased. When the direction of the magnetization is kept at an angle of 30 to 60° with respect to the current-flowing direction, an excellent playback waveform is obtained.

Figure 13A:
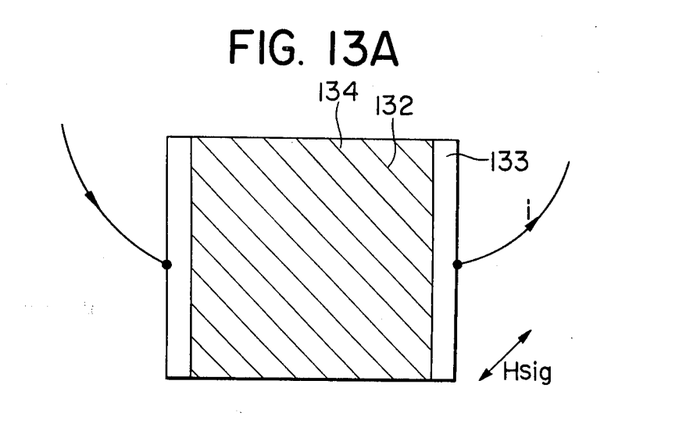
FIG. 13A is a plan view of a magnetoresistive element according to a sixth embodiment of the present invention.
Figure 13B:
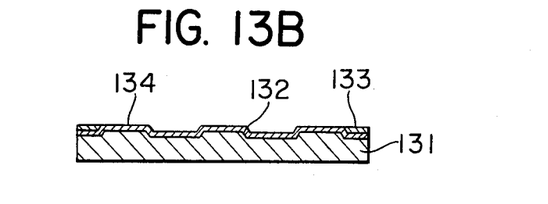
FIG. 13B is a sectional view of the element shown in FIG. 13A, and FIGS. 13C and 13D are graphs for explaining the magnetoresistive characteristics.
Figure 13C:
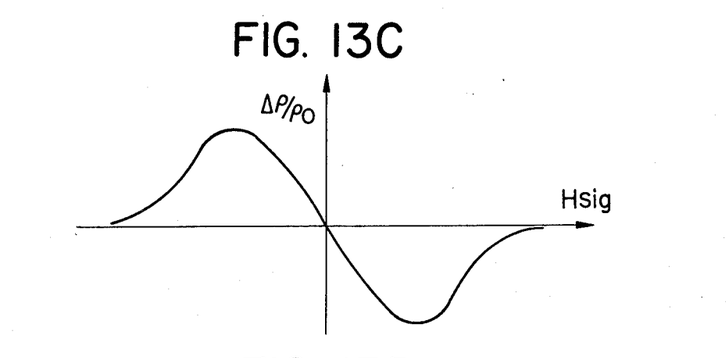
Figure 13D:
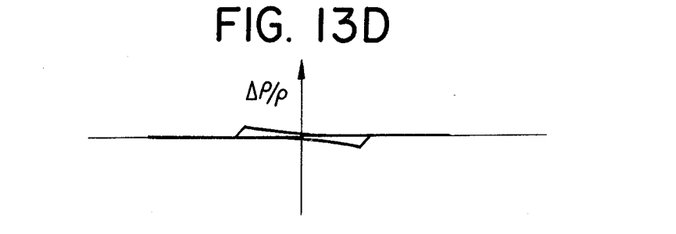

FIGS. 13A and 13B show a magnetoresistive element according to a sixth embodiment of the present invention. FIGS. 13C and 13D show magnetoresistive characteristics of the element shown in FIGS. 13A and 13B. A grating pattern 132 is formed on the surface of a rectangular substrate 131. The grating pattern 132 is inclined at 45° with respect to the direction of the current i flowing through the magnetoresistive element. Electrodes 133 are formed at two ends of the MR element, so that the current flows uniformly through the MR element.

Figure 14:
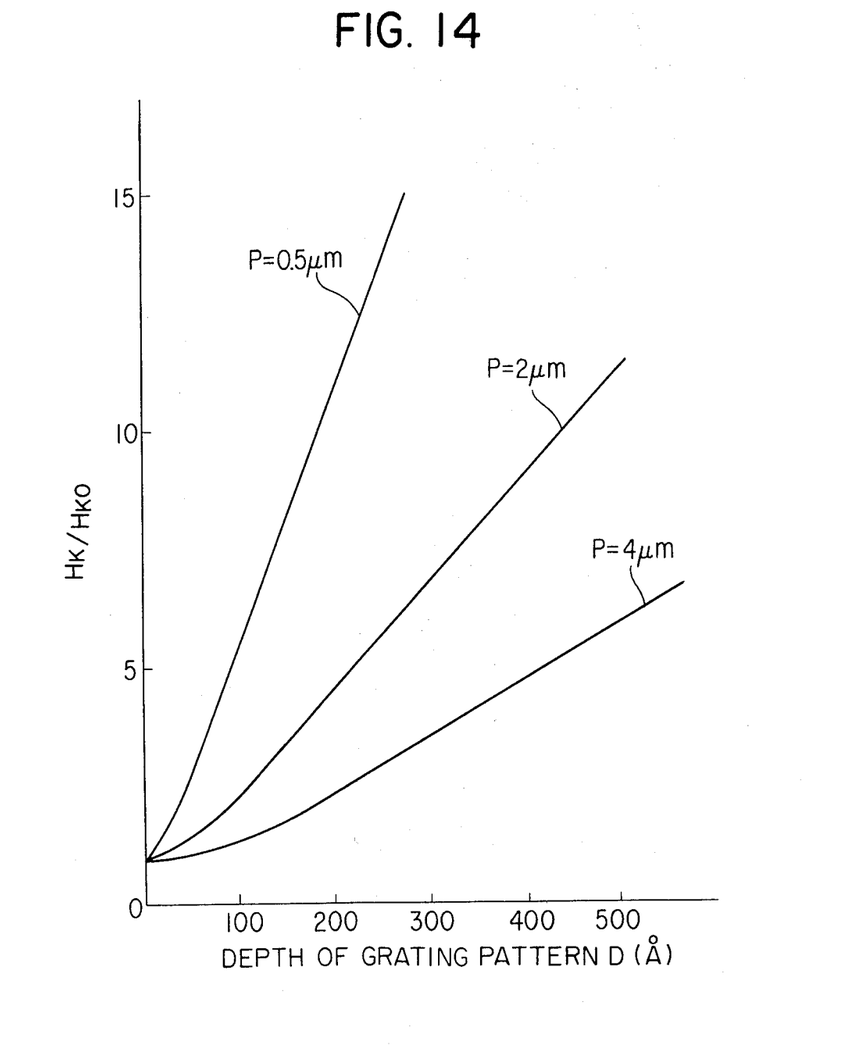
FIG. 14 is a graph for explaining dependency of the anisotropic magnetic field on a depth of the grating pattern.

After the linear grating pattern 132 is formed on the substrate 131, an MR film 134 is deposited thereon. The axis of easy magnetization of the MR film 134 is oriented along the direction of the grating pattern 132 on the surface of the substrate 131. The intensity of the anisotropic magnetic field $H_K$ is controlled by the depth of the grating and the pitch of the grating pattern. FIG. 14 shows the relationship between the ratio $(H_K/H_{K0})$ of the anisotropic magnetic field $H_K$ obtained with the grating pattern to an anisotropic magnetic field $H_{K0}$ induced by the magnetic field, when the MR film is deposited on the flat substrate, and the pitch P and the depth D of the grating. In order to obtain a sufficiently intense anisotropic magnetic field $H_K$, the grating pitch must be about 0.5 μm in a shallow depth of the grating pattern. If the pitch is 2 μm, a depth of more than 400 Å is required to obtain a sufficiently intense anistropic magnetic field.

The obtained MR film with magnetic anisotropy has the characteristics shown in FIGS. 13C and 13D. FIG. 13C show a characteristic curve when a magnetic field $H_{sig}$ is applied perpendicularly to the grating direction; FIG. 13D shows a characteristic curve when the magnetic field $H_{sig}$ is applied parallel to the grating pattern. In the former case, the response of the ratio $\Delta\rho/\rho_0$ of a change $\Delta\rho$ in specific resistance $\rho_0$ linearly changes when the magnetic field is small, thus obtaining excellent linearity. The change in the ratio $\Delta\rho/\rho_0$ shows the maximum, and the increment of the ratio $\Delta\rho/\rho_0$ is determined by variation of the magnetic field. Therefore, the polarity of the magnetic field can be readily understood. However, in the latter case as shown in FIG. 13D, a change in the ratio $\Delta\rho/\rho_0$ is small, and the value of the ratio $\Delta\rho/\rho_0$ is minimum in this case. By comparison of the cases in FIGS. 13C and 13D, the ratio $\Delta\rho/\rho_0$ changes to have a cycle of 360° with respect to the direction of the magnetic field. By using the magnetoresistive element as shown in FIGS. 13A and 13B, the relative inclination between the magnetic field and the magnetoresistive element can be detected.

Figure 15A:
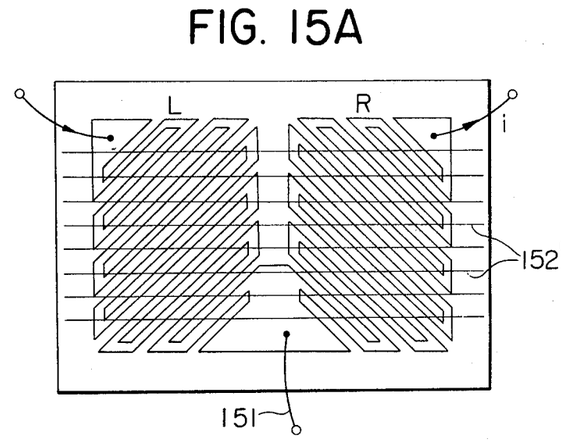
FIG. 15A is a plan view of a magnetoresistive element according to a seventh embodiment of the present invention.
Figure 15B:
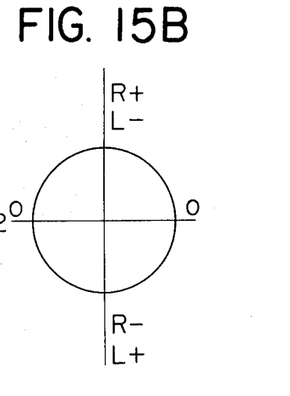
FIG. 15B is a graph for explaining the magnetoresistive characteristics of the element shown in FIG. 15A.

FIG. 15A shows a magnetoresistive element according to a seventh embodiment of the present invention. The magnetoresistive element in FIG. 15A is the same as that in FIG. 13 except that the MR film is subdivided into strips to increase the resistance, and has two element portions L and R whose strips are perpendicular to each other and which have a central terminal 151 arranged therebetween. Thus, the direction of the magnetic field is highly precisely detected. FIG. 15B shows the magnetoresistances of the right and left element portions R and L on application of the magnetic field. When the current i flows from the left element portion L to the right element portion R as shown in FIG. 15A, an output from the left element portion L is high with respect to the central terminal 151, while an output from the right element portion R is low with respect to the central terminal 151. As shown in FIG. 15B, selectivity of the output with respect to the angle is further improved.

Figure 16A:
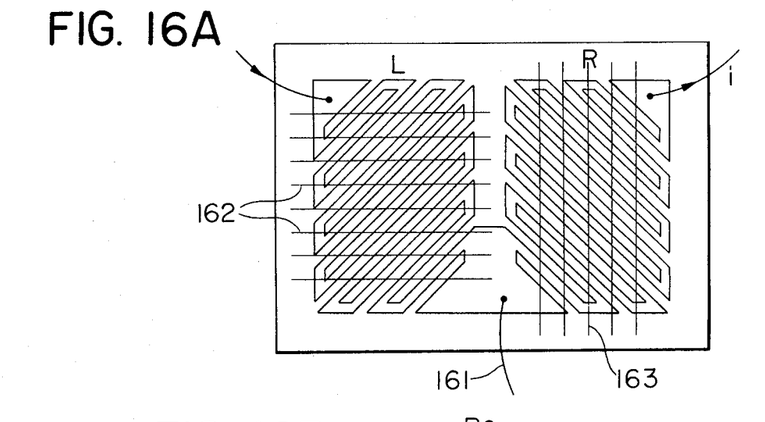
FIG. 16A is a plan view of a magnetoresistive element according to an eighth embodiment of the present invention.
Figure 16B:
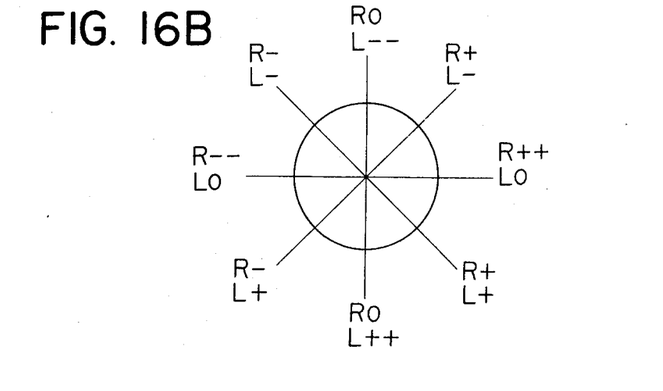
FIG. 16B is a graph for explaining the magnetoresistive characteristics of the element shown in FIG. 16A.

FIG. 16A shows a magnetoresistive element according to an eighth embodiment of the present invention. Two MR element portions are formed in such a manner that their strips are perpendicular to each other. Further, grating patterns 162 and 163 respectively formed in the left and right element portions L and R are also perpendicular to each other. Furthermore, an angle formed by the grating patterns and paths (strips) of the element portions is 45°. A central terminal 161 is arranged between the right and left element portions R and L. The current i flows through the right and left element portions R and L. Voltages generated in the right and left element portions R and L are measured. In the magnetoresistive element with the arrangement shown in FIG. 16A, the element portions R and L are perpendicular to each other, and the grating patterns 162 and 163 as the respective axes of each magnetization are perpendicular to each other. Thus, the direction of the magnetic field can be more precisely measured than in the case shown in FIG. 15A. Since the axes of easy magnetization of the right and left element portions R and L are perpendicular to each other, as shown in FIG. 16B, the direction which indicates the minimum output of the right element portion R differs from that of the left element portion L. Further, since the current applied to the right element portion R is perpendicular to that applied to the left element portion L, outputs from the right and left element portions R and L respectively become zero every 90°. The peak value + + is detected at a phase angle of 90°, while the peak value − − is detected at a phase angle of 180°. The absolute values of outputs from the right and left element portions R and L are the same at intermediate points at an angle of 45°, so that the outputs from the right and left element portions R and L respectively cancel each other at these points. The magnetoresistive element of the eighth embodiment more accurately detects the direction of the magnetic field than the magnetoresistive element of the seventh embodiment shown in FIG. 15A.

In the sixth, seventh and eighth embodiments of the present invention, the grating pattern is formed on the surface of the substrate of the MR element. The anisotropic magnetic field of the MR element is aligned along the grating pattern. Further, the intensity of the anisotropic magnetic field $H_K$ is sufficiently increased controlled by the grating pattern. The linear portion of MR characteristics is increased so that the dynamic range is widened. As a result, a new MR element for highly precisely detecting the direction of the magnetic field is provided.

Figure 17A:
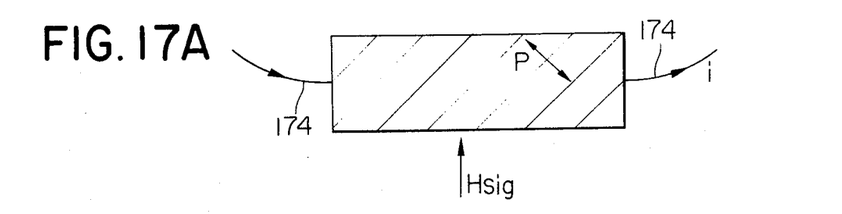
FIG. 17A is a plan view of a magnetoresistive element according to a ninth embodiment of the present invention.
Figure 17B:
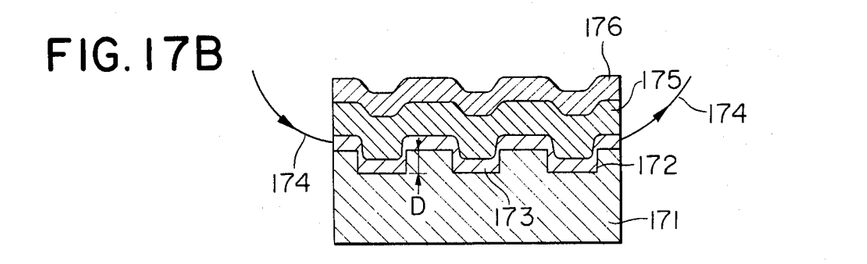
FIG. 17B is a sectional view of the element shown in FIG. 17A.

FIGS. 17A and 17B show a magnetoresistive element according to a ninth embodiment of the present invention. A grating pattern 172 is formed on the surface of a rectangular substrate 171. The direction of the grating pattern 172 is inclined by about 45° with respect to the direction of the current i flowing through the element. An MR film 173 is deposited on the grating pattern 172 and has the same indentation pattern as the pattern 172. Electrodes 174 are arranged at the two ends of the substrate 171, so that the constant current i flows through the MR element. Referring to FIG. 17B which shows a cross-section of the MR element, an insulating layer 175 is formed on the MR film 173, and a shield film 176 is formed on the insulating layer 175. The shield film 176 is electrically insulated from the MR film 173 and the electrodes 174.

The intensity of the anisotropic magnetic field of the shield 176 formed on the insulating layer 175 is as great as that of the MR film 173 formed on the grating pattern 172. As a result, permeability of the shield film 176 is decreased, and the shielding effect of the shield film 176 tends to be degraded. However, since the MR film 173 and the insulating layer 175 are formed under the shield film 176, the degradation in the shielding effect can be improved when the shape of the grating pattern 172 is slightly flattened on the surface of the shield film 176.

Figure 18A:
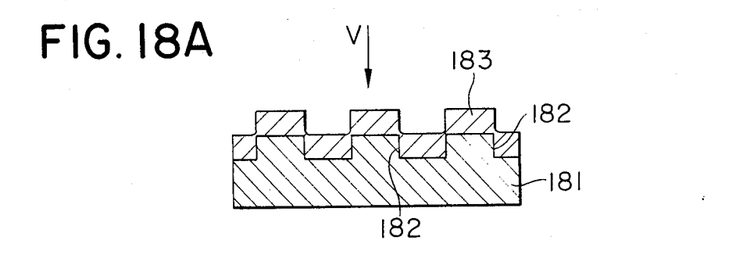
FIGS. 18A, 18B and 18C are sectional views showing insulating films on grating patterns which are formed on substrates, respectively.
Figure 18B:
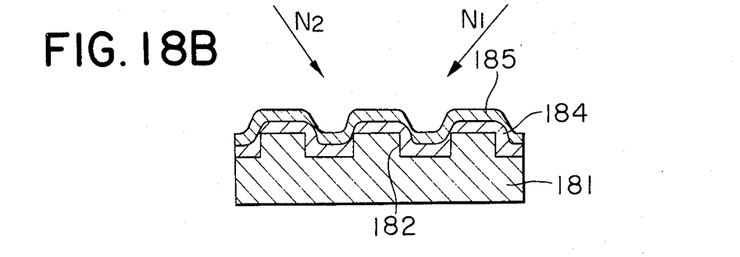
Figure 18C:
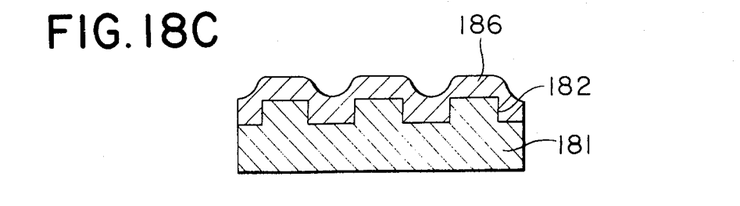

FIGS. 18A, 18B and 18C show respectively changes in grating patterns reformed by deposition on the substrate. FIG. 18A shows surface steps when an insulating layer 183 of, for example, silicon dioxide is vacuum deposited vertically on a substrate 181 which has a grating pattern 182 thereon. In this case, the grating of the insulating film 183 is substantially the same as that of the substrate 181. When a shield film is formed on the insulating layer 183, its permeability is degraded. Referring to FIG. 18B, a first insulating layer 184 is deposited from the direction indicated by arrow $N_1$ and then a second insulating layer 185 is deposited on the first insulating film 184 from the direction indicated by arrow $N_2$. The insulating material is mainly deposited on step portions of the substrate 181, so that the step portions are rounded. Thus, the step difference of the shield film formed on the insulating layer is improved, and the anisotropic magnetic field of the shield film is weakened, while its permeability is increased. Referring to FIG. 18C, an insulating film 186 is deposited by sputtering in the same manner as in FIG. 18B to round the edges of the grating. The edges in FIG. 18C are more round than those in FIG. 18B. Further, deposition is performed only once, decreasing the manufacturing cost.

As described above, the grating pattern can be smoothed by deposition within a given limitation. However, if the depth of the grating pattern must be sufficiently smaller than the thickness of the insulating film, the following process must be used.

Figure 19:
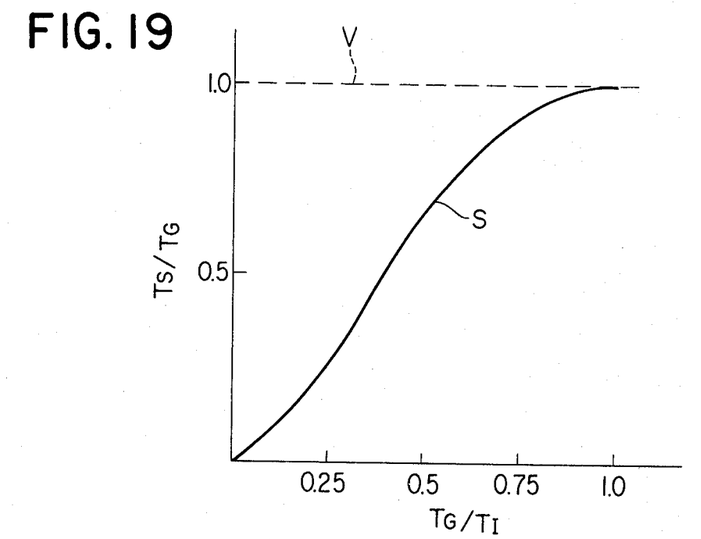
FIG. 19 is a graph for explaining the thickness of the insulating film formed on the grating pattern on the substrate as a function of the depth of the grating pattern.

FIG. 19 shows a ratio of the depth $T_s$ of the grating pattern on the insulating film to the depth $T_G$ of the grating on the substrate, as a function of a ratio of the depth $T_G$ of the grating pattern on the substrate to a thickness $T_I$ of the insulating film. The grating pattern on the deposited insulating film is a replica of the grating pattern on the substrate when vacuum deposition is vertically performed with respect to the surface of the substrate, which is indicated by symbol V. Even if the thickness $T_I$ of the deposited insulating film is increased, the ratio $T_s/T_G$ may not be decreased and remains unit. Further, since the edges of the grating pattern may not be rounded, the magnetic charge generated when the MR element is magnetized is the same as that generated when the shield film is directly deposited on the grating pattern without forming the deposited insulating film. Thus, the intensity of the anisotropic magnetic field remains large. As a result, the permeability of the shield film is not improved.

In the case when sputter deposition of insulating film is performed, since the grating pattern of the deposited insulating film is smoothed, and the edges of the grating pattern are rounded, on the shield film deposited on the grating pattern, the magnetic charge generated by the signal magnetic field is decreased. As a result, the permeability of the shield film is increased so that its shielding effect is greatly improved. As the ratio $T_G/T_I$ is decreased, the ratio $T_s/T_G$ gradually decreases. When the ratio $T_G/T_I$ is less than 0.5, the ratio $T_s/T_G$ is less than 0.6. If the depth $T_G$ of the grating pattern on the substrate is 100 Å, the depth $T_s$ of the grating pattern on the deposited insulating film is as small as 60 Å, the surface thereof acting as the base body on which the shield film is formed is regarded as flat. The permeability of the shield film deposited on the grating pattern of the insulating film is the same as that of the flat substrate. Thus, the shield film provides the satisfactory shielding effect. Thus, the above-mentioned process may be adopted as needed to obtain a shield film which has excellent shielding characteristics.

Figure 20:
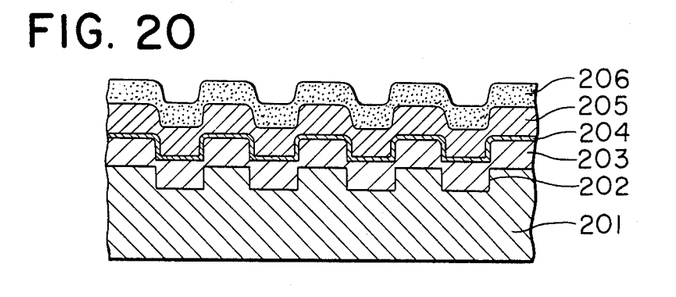
FIG. 20 is a sectional view of a magnetoresistive element according to a tenth embodiment of the present invention.

FIG. 20 shows an MR sensor which reproduces a short wavelength signal and which comprises a magnetoresistive element according to a tenth embodiment of the present invention. An MR film 204 is formed on a magnetic substrate 201 which has a shield effect separated by an insulating layer 203. A shield layer 206 is formed on the MR film 204 separated by another insulating layer 205. In this case, an grating pattern 202 is formed on the magnetic substrate 201 in such a manner that a photoresist pattern is formed as a mask by holographic grating on the magnetic substrate 201, and the magnetic substrate is then ion-milled or sputtering-etched through windows of the photoresist pattern. The insulating layer 203 is first deposited on the indented surface of the magnetic substrate 201, and then the MR film 204 is deposited on the insulating layer 203. If the magnetic substrate 201 comprises a polycrystalline body, the etching rate when ion milling or sputtering is performed may vary depending on the crystal orientation. Therefore, the surface of the etched surface is roughened. For obtaining a smooth etched surface, a single crystalline magnetic substrate is preferred.

In this embodiment where the grating pattern is formed on the magnetic substrate 201, the magnetic gap between the magnetic substrate 201 and the MR film 204 is kept at a predetermined distance. However, since the magnetic signal recorded on a recording medium is aligned in line, signals which have different phases are simultaneously reproduced from the recording medium when the step of the grating pattern is great in the MR film whose top surface has the same grating pattern as that formed on the magnetic substrate. Thus, the playback signal is expressed by the following expression:

$$\tfrac{1}{2}\cdot\cos(2\pi t/\lambda)+\tfrac{1}{2}\cdot\cos(2\pi(t+a)/\lambda)$$

where λ is the wavelength of the recorded signal, and a is the phase difference of the signals. When the wavelength λ of the recorded signal is shortened, the attenuation of the signal is great. When the depth of the grating pattern of the MR film is more than ¼ of the gap length, the phase difference a does not provide practical industrial applications, since the edge of the grating pattern of the shield film and the edge of the MR film come close to each other and the signal magnetic field in the MR element interfere with each other between the adjacent gratings. Erroneous playback signals are thus reproduced.

It is impossible to electrically insulate the MR film 204 from the shield film by providing a gap length of less than 0.2 μm. Thus, a gap length of 0.2 μm is regarded as the lower limit. Thus, the depth of the grating pattern on the substrate is preferably less than 500 Å. As shown in FIG. 14, in order to sufficiently increase the ratio $H_K/H_{K0}$ at a grating depth of less than 500 Å, the grating pitch must be less than 2 μm. Thus, by controlling the pitch and depth of the grating pattern, the intensity of the anisotropic magnetic field $H_K$ can be controlled.

Figure 21A:
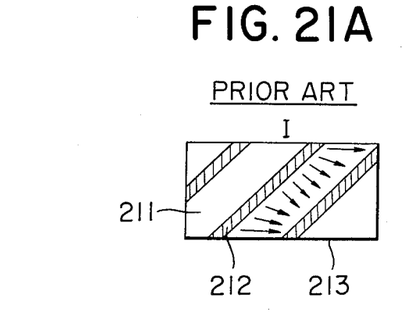
FIGS. 21A and 21B are views showing the mode of opeation of conventional barber pole type magnetoresistive elements.
Figure 21B:
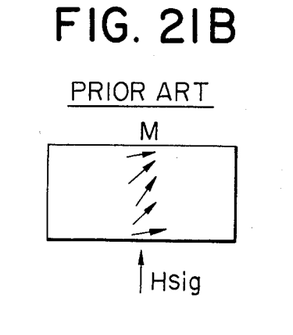

In the barber pole type MR element (K. E. Kuijk et. al., 1975, IEEE MAG-II, P. 125) wherein a current flows through the MR element at an angle of 45° with respect to the longitudinal direction thereof, the rotating angle of a magnetization M at the ends of the element is small due to the magnetic charge generated at the ends of the MR element on application of the signal magnetic field $H_{sig}$, as indicated by arrows in FIG. 21B. While, the rotating angle of the magnetization M is large at the center of the MR element. Since conductive wires of a material such as Au, Cu and Al which have a sufficiently small specific resistance as compared with the specific resistance of the MR element are arranged on an MR element 211 substantially at an angle of 45° with respect to the longitudinal direction of the MR element, a current I flows through an MR element end portion 213 therealong, as shown in FIG. 21A. Referring to both FIGS. 21A and 21B, at the center of the MR element, the magnetization M is very responsive to the signal magnetic field $H_{sig}$ and the current I is biased at an angle of 45° with respect to the longitudinal direction of the element, so that the output waveform is little distorted. At the element end portion, the magnetization M is not much responsive to the signal magnetic field $H_{sig}$ as at the center of the MR element, and the current I flows along the MR element end portion. The portion which is adjacent to the magnetic medium has low sensitivity. Therefore, the output characteristics for the short wavelength signal are poor. In addition to this, the demagnetizing field along the transverse direction of the MR element is changed due to the abrasion of the MR head along the direction of its width. The demagnetizing field determines the dynamic range with respect to the signal magnetic field of the MR element. If the demagnetizing field is changed due to the abrasion of the head, the dynamic range is changed, thus resulting in inconvenience in practice.

If the shield is provided with one surface of the MR film, the magnetic charge is not generated at the ends of the MR element, so that the demagnetizing field is weakened. Therefore, the dynamic range is narrowed. At this time, the dynamic range is determined by the reluctance of the shield film and MR film, and by the permeance of the magnetic gap between the shield film and the MR film. The dynamic range does not satisfy practical applications.

However, according to the present invention, since the grating pattern is formed on the MR film, the direction and intensity of the anisotropic magnetic field can be controlled, so that an MR element which has a wide dynamic range and an MR sensor or MR head are provided, whose dynamic range is not affected by the element arrangement such as the shape of the MR element and formation of the shield film. The rotation of the magnetization is kept constant over the entire region of the element by the formation of the grating pattern. Therefore, the present invention provides an MR element which reproduces a shorter wavelength signal than that recorded on the recording medium than that in the prior art.

Figure 22A:
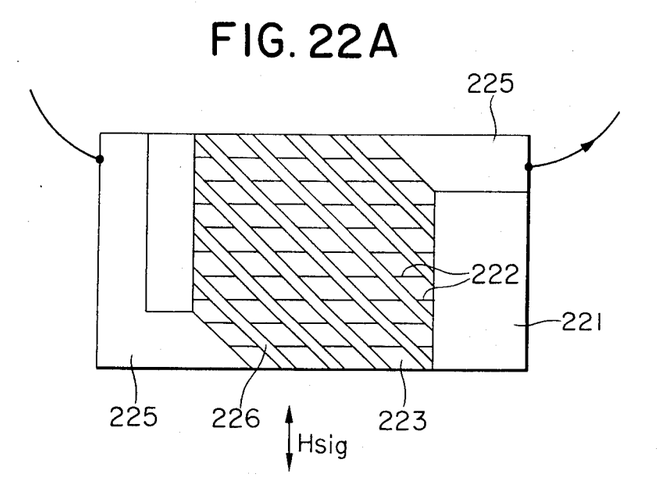
FIG. 22A is a plan view of a magnetic head according to an eleventh embodiment of the present invention.

FIG. 22A shows a magnetoresistive element according to an eleventh embodiment of the present invention. A grating pattern 222 is formed on a substrate 221 to be substantially parallel to one side of the MR element. A linear resist pattern is formed by photolithography on the substrate 221 and the substrate 221 is etched using the resist pattern as a mask so as to form the grating pattern 222. Alternatively, the grating pattern 222 may also be formed by lapping with an abrasive. Thereafter, an MR film 223 is formed on the grating pattern. Electrodes 225 are arranged at the two ends of the MR film 223 to supply a constant current to the MR element. The material for the electrodes 225 may be selected from Cu, Al, and Au which have a small specific resistance. When the electrodes 225 are formed, small strips 226 are simultaneously arranged at predetermined intervals at an angle of 45° with respect to the direction of the grating pattern. Thus, the current flows at an angle of 45° with respect to the grating pattern.

Figure 22B:
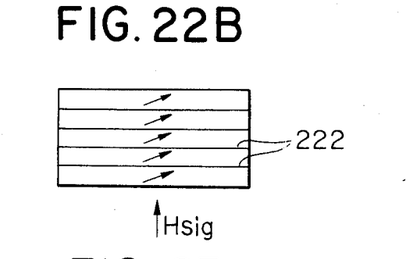
FIG. 22B is a view for explaining the mode of operation of the head shown in FIG. 22A.

The magnetization of the MR element with the above arrangement has a domain structure where the domains are subdivided at the gratings, as shown in FIG. 22B. The flat portion between the steps of the grating patterns 222 can be regarded as a single domain. The single domain provides a uniform demagnetizing field for each single domain when the indentation pitch is uniform. Further, the magnetization of each single domain is coherently rotated by a signal magnetic field being externally applied. As compared with the case shown in FIG. 21B wherein the sensitivity in the vicinity of the end portion is lowered due to the magnetic charge generated at the end portions of the MR element, the MR element uniformly operates at the center and end portions thereof, so that the sensitivity at the element portion near the surface of the magnetic medium is increased. The portion near the magnetic medium has the highest intensity of the magnetic field. Further, when the sensitivity of the element portion near the surface of the recording medium is increased the element portion which has less spacing loss has a high sensitivity, providing high responsiveness to a short wavelength signal.

Figure 23:
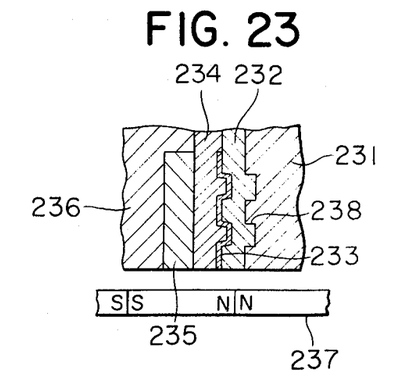
FIG. 23 is a sectional view showing the main part of a magnetoresistive element according to a twelfth embodiment of the present invention.

In an MR element which has a shield provided with at least one side of the MR film thereof according to a twelfth embodiment of the present invention as shown in FIG. 23, a magnetic circuit is constituted by magnetic shields 231 and 235, magnetic gaps 232 and 234, and an MR film 233, so that it is difficult to obtain a dynamic range corresponding to the signal magnetic field applied form a recording medium 237. The gaps between the MR film 233 and the shields 231 and 235 are determined by the wavelength of the signal recorded on the recording medium 237, so that the magnetic circuit of the MR film and the shields is determined. Therefore, the dynamic range determined by the sum of the anisotropic magnetic field of the MR element and the signal magnetic field cannot be dealt with as a design feature of the MR element.

As shown in FIG. 23, if a grating pattern 238 is formed on the substrate and then the MR film 233 is deposited on the grating pattern 238, magnetic anisotropy along the grating pattern 238 can be induced, so that its anisotropic magnetic field can be controlled by the depth and pitch of the grating pattern.

As shown in FIG. 14, when the pitch and depth of the grating pattern are controlled, the dynamic range of the element as the magnetic sensor can be widened. Further, when the magnetic gap between the MR film and the shield is decreased, the magnetic flux leakage increases, and the demagnetizing field decreases. Therefore, the MR element having a small magnetic gap has a small dynamic range. Conventionally, the MR sensor for reproducing a signal with a short wavelength has a small dynamic range. However, according to the present invention, in the MR sensor for reproducing a signal with a short wavelength, the dynamic range can be widened.

What is claimed is:

1. A magnetoresistive element comprising a substrate, a magnetoresistive film of a ferromagnetic body formed on said substrate, and at least two electrodes disposed on said magnetoresistive element, wherein a linear grating pattern is unidirectionally formed on at least one surface of said magnetoresistive film.

2. An element according to claim 1, wherein said linear grating pattern has random interval of grating repetition.

3. An element according to claim 1, wherein said linear grating pattern has a periodic pitch of the grating repetition.

4. An element according to claim 1, wherein a direction of said linear grating pattern is parallel to the direction of magnetic anisotropy of said magnetoresistive film.

5. An element according to claim 1, wherein a direction of said linear grating pattern is substantially parallel to the direction of a current flowing through said magnetoresistive film.

6. An element according to claim 1, wherein a direction of said linear grating pattern is inclined at 30° to 60° with respect to the direction of a current flowing through said magnetoresistive film.

7. An element according to claim 1, wherein a bias magnetic field is applied to an anisotropic magnetization along said linear grating pattern to set the direction of said magnetization in one direction.

8. A magnetoresistive element comprising a substrate and a magnetoresistive film of a ferromagnetic body formed on said substrate, wherein a linear grating pattern is unidirectionally formed on a surface facing to said substrate, the direction of said linear grating pattern is inclined by 30° to 60° with respect to the direction of a current flowing through said magnetoresistive film, and the pitch of said grating pattern is not more than 5 μm.

9. A magnetoresistive element comprising a substrate, and a magnetoresistive film of a ferromagnetic body formed on said substrate, wherein a linear grating pattern is unidirectionally formed on at least one surface of said magnetoresistive film, and the direction of said linear grating pattern is inclined at 45° with respect to the direction of a current flowing through said magnetoresistive film.

10. A magnetoresistive element comprising a substrate, a magnetoresistive film consisting of a pair of magnetoresistive element portions of a ferromagnetic body which are perpendicular to each other and which are formed on said substrate, and a central terminal arranged between said pair of magnetoresistive element portions, wherein linear grating patterns are formed on at least one surface of said pair of magnetoresistive element portions, respectively, and directions of said linear grating patterns are respectively inclined at substantially 45° with respect to said magnetoresistive element porions.

11. An element according to claim 10, wherein said linear grating patterns respectively formed on said at least one surface of each of said magnetoresistive element portions are perpendicular to each other.

12. A magnetoresistive element comprising: a base member which has a unidirectional linear grating pattern thereon, a magnetoresistive film of a ferromagnetic body formed on said base member, at least two electrodes arranged on said magnetoresistive film, and a magnetic shield layer formed on said magnetoresistive film separated by a magnetic gap.

13. An element according to claim 12, wherein a depth of said linear grating pattern is not more than half a thickness of said magnetic gap.

14. A magnetoresistive element comprising a magnetic substrate which has a unidirectional linear grating pattern thereon, and a magnetoresistive film of a ferromagnetic body formed on said linear grating pattern through a magnetic gap, wherein the direction of said linear grating pattern is inclined at 30° to 60° with respect to the direction of a current flowing through said magnetoresistive film, and the pitch of said linear grating pattern is not more than 2 μm.

15. An element according to claim 14, wherein said magnetic substrate comprises single crystalline material.

16. A magnetoresistive element comprising a base member which has a unidirectional linear grating pattern thereon, a magnetoresistive film of a ferromagnetic body formed on said linear grating pattern, and conductive strips which have a small specific resistance and which are arranged on said magnetoresistive film at equal intervals, wherein the direction of said conductive strips is inclined at substantially 45° with respect to the direction of said linear grating pattern.

17. A magnetoresistive element comprising a base member which has a unidirectional linear grating pattern thereon, a magnetoresistive film of a ferromagnetic body formed on said base member, a magnetic shield provided with at least one surface of said magnetoresistive film, which is separated by a magnetic gap and conductive strips which have a small specific resistance and which are arranged on said magnetoresistive film at equal intervals, wherein the direction of said conductive strips is inclined at substantially 45° with respect to the direction of said linear grating pattern.

* * * * *